United States Patent [19] [11] 3,906,359
Blaha et al. [45] Sept. 16, 1975

[54] MAGNETIC FIELD SENSING CCD DEVICE WITH A SLOWER OUTPUT SAMPLING RATE THAN THE TRANSFER RATE YIELDING AN INTEGRATION

[75] Inventors: Franklyn C. Blaha, Glen Burnie; Harry G. Oehler, Laurel, both of Md.

[73] Assignee: Westinghouse Electric Corporation, Pittsburgh, Pa.

[22] Filed: Aug. 6, 1973

[21] Appl. No.: 386,253

[52] U.S. Cl. .................. 324/43 R; 307/309; 357/24; 357/27
[51] Int. Cl.² .................... G01R 33/02; H01L 29/78
[58] Field of Search ...................... 324/43 R, 45, 46; 317/235 G; 357/24, 27; 307/309

[56] References Cited

UNITED STATES PATENTS

| | | | |
|---|---|---|---|
| 3,651,349 | 3/1972 | Kahng et al. | 317/235 G |
| 3,760,202 | 9/1973 | Kosonocky | 317/235 G |

OTHER PUBLICATIONS

Bertin, C., Charge-Coupled Device Hall Effect Detector, IBM Tech. Bull., Vol. 15, No. 4, Sept. 1972, P. 1346.

Chang et al., Charge-Coupled Device Magnetic Field Sensor, IBM Tech. Bull., Vol. 14, No. 11, Apr., 1972, p. 3420.

*Primary Examiner*—Robert J. Corcoran
*Attorney, Agent, or Firm*—D. Schron

[57] ABSTRACT

A charge coupled device is disclosed for sensing magnetic fields, and including a semiconductor substrate covered by a dielectric layer, a source for injecting carriers into the substrate, a plurality of electrodes disposed across the exposed surface of the dielectric layer, drive voltage sources for applying varying voltages to adjacent electrodes whereby "potential wells" are formed under selected electrodes and are moved across the substrate to a plurality of output electrodes. The substrate is placed in a magnetic field to be detected, whereby the path of the carriers through the substrate is deflected according to the strength and direction of the magnetic field. As a result, the distribution of carriers within the semiconductor substrate is uneven and the output derived from the electrodes varies in magnitude according to the direction and strength of the magnetic field. The shape and size of the electrodes is increased between the source of carriers and the output electrodes to permit the carrier displacement under the influence of the sensed magnetic field. The last electrode includes a plurality of fingers or other isolating means for defining the flow of carriers directed therepast to the output electrodes.

10 Claims, 16 Drawing Figures

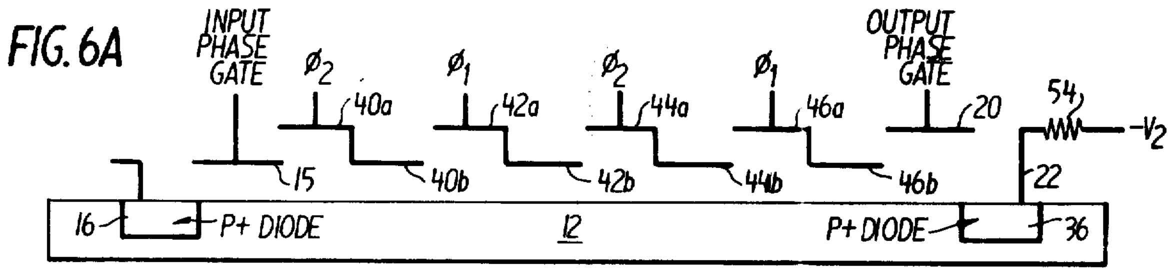
FIG. 6B
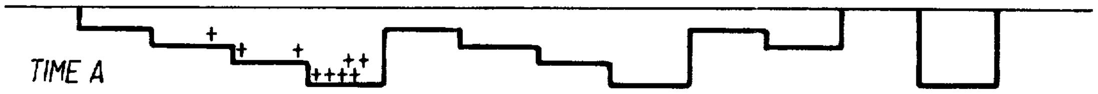
FIG. 6C
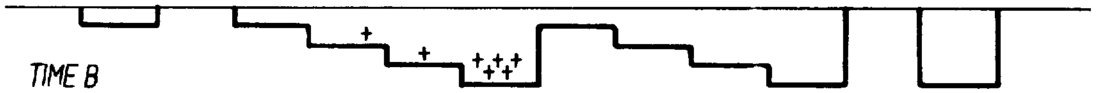
FIG. 6D
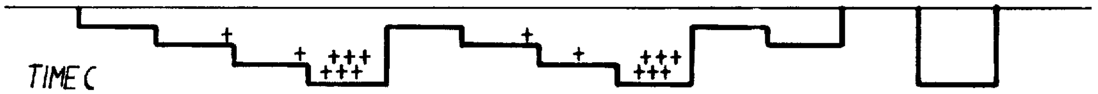
FIG. 6E
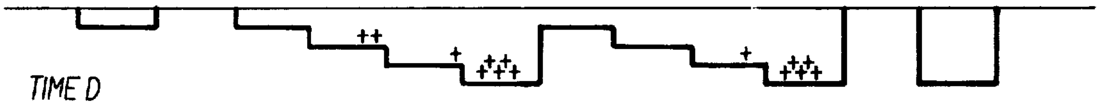
FIG. 6F
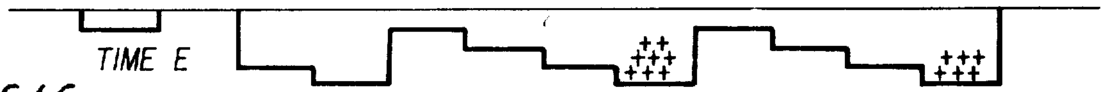
FIG. 6G
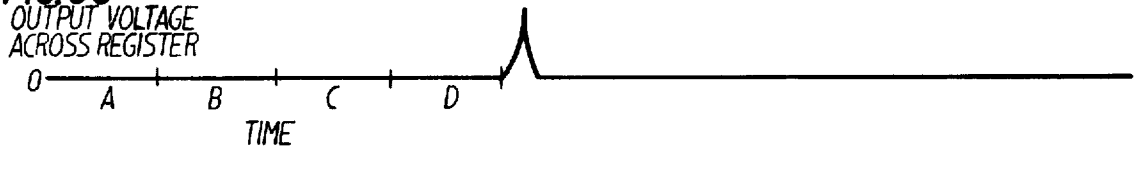

FIG. 7A $\phi_1$
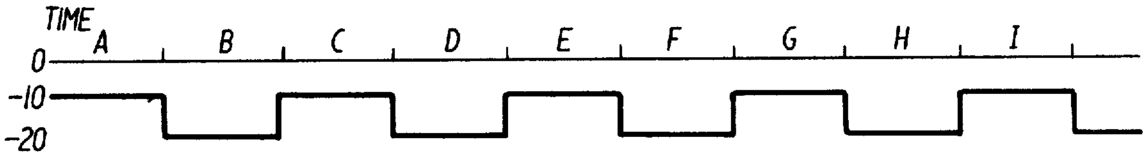
FIG. 7B $\phi_2$
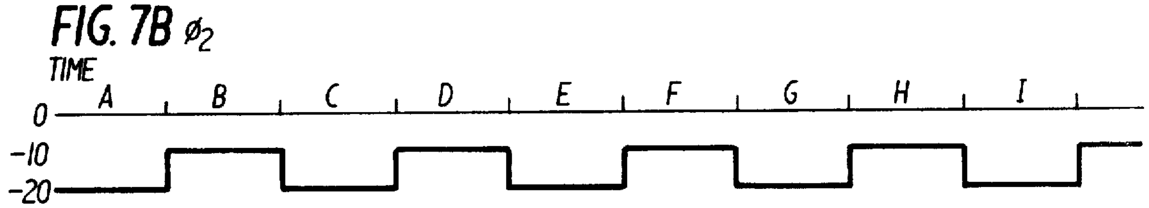
FIG. 7C INPUT PHASE GATE
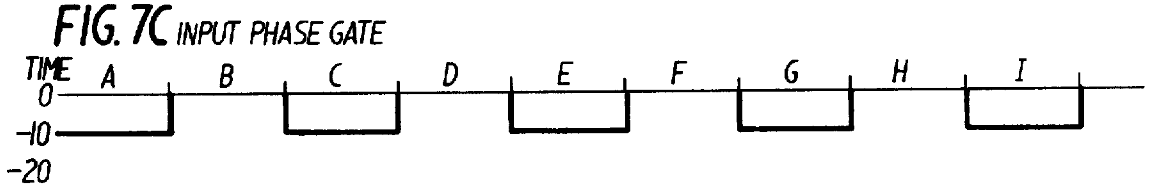
FIG. 7D OUTPUT PHASE GATE
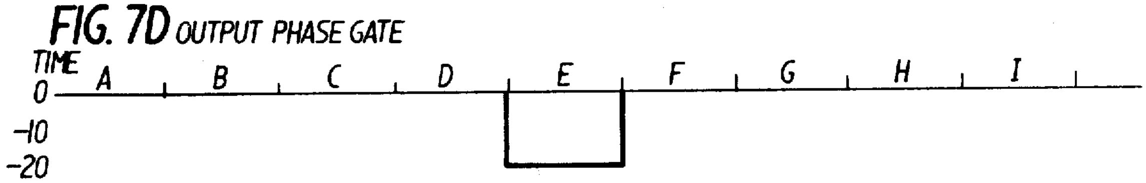

MAGNETIC FIELD SENSING CCD DEVICE WITH A SLOWER OUTPUT SAMPLING RATE THAN THE TRANSFER RATE YIELDING AN INTEGRATION

CROSS-REFERENCE TO RELATED APPLICATIONS

Reference Device made to commonly assigned co-pending application entitled, "Coherent Sampled Readout Circuit and Signal Processor for a Charge Coupled Device Array", filed in the names of Marvin H. White, David H. McCann, Jr., Ingham A. G. Mack and Franklyn C. Blaha, now U.S. Pat. No. 3,781,574, and application entitled, "A Charge Coupled Device Area Imaging Array", filed in the names of Marvin H. White and Gene Strull now U.S. Pat. No. 3,826,926.

BACKGROUND OF THE INVENTION

1. Field of the Invention

This invention relates to charge coupled devices, and in particular to those charge coupled devices adapted to sense the direction and strength of a magnetic field.

2. Description of the Prior Art

Hall effect devices such as that described by R. C. Gallagher and W. S. Corak in their article, "A Metal-Oxide-semiconductor (MOS) Hall Element", Solid State Electronics, pp. 571–580, 1966, have been used to sense a magnetic field. The subject article describes an MOS transistor structure wherein Hall voltages are obtained in its silicon substrate. This article discusses the effect of the magnetic field to produce a Hall effect voltage as a function of the drain-source current, the gate-source voltage, the magnetic field strength and the geometric length-to-width ratio of the inversion layer.

A new type of semiconductor device has been developed recently and is known as a "charge coupled device" (CCD), comprising an n- or p-type silicon substrate, an MOS-type silicon dioxide insulation layer and a metallized electrode, as described in the article entitled, "Charge-coupled devices — A new approach to MIS device structures", IEEE Spectrum, July 1971. Significantly, no p-n junctions as are formed in the above-referenced MOS Hall effect device, are required. Basically, minority carriers are injected into the silicon substrate and are stored under various electrodes dependent upon the voltages applied thereto. For example, an n-type silicon substrate has a threshold voltage of about −1 to −2 volts; upon the application of such voltage to the dielectrically isolated adjacent electrodes, a uniform depletion layer forms beneath all electrodes. To effect a storage mode, a more negative voltage in the order of −10 volts is applied to one of the plurality of electrodes disposed upon the silicon dioxide layer whereby a deeper depletion region beneath that selected electrode is formed to define a "potential well". Such a device now can receive and store charges and, in effect, acts as a memory. To effect a transfer of holes from one electrode to the next, a still more negative voltage in the order of approximately −20 volts is applied to an adjacent electrode, whereby a well of even greater potential is formed under that electrode, which attracts to it the holes stored under the aforementioned electrode. In this manner, the well of holes may be transferred successively from one area of the semiconductor substrate to the next, the areas being defined by the electrodes. Using such a structure, a shift register may be formed wherein a charge of holes is successively moved through a semiconductor substrate to be collected by an output electrode or diode.

SUMMARY OF THE INVENTION

It is therefore an object of this invention to adapt the charge coupled phenomena to detect the strength and direction of a magnetic field.

It is a further object of this invention to provide a charge coupled device that is exceptionally sensitive to magnetic fields.

These and other objects are met in accordance with the teachings of this invention by providing a charge coupled device comprising a substrate of a semiconductive material, a dielectric layer disposed thereon, a source for injecting carriers into the semiconductive substrate, and a plurality of electrodes disposed upon the dielectric layer. Varying voltages are applied to the electrodes for transferring carriers from one "well" as defined by the electrodes to the next through the semiconductor substrate to a plurality of output electrodes. The electrodes are so configured and dimensioned that they increase successively in area from the carrier source to output electrodes, whereby a magnetic field effects a carrier displacement such that the strength and direction of the magnetic field are detected by measuring the carrier distribution as the carriers flow to the output electrodes. Thus, the relative strength of the current derived from the output electrodes is indicative of the strength and direction of the magnetic field to which the CCD structure is exposed.

In an illustrative embodiment of this invention, the electrodes are configured to form a wedge-like shape and the outer periphery of the last electrode includes a plurality of isolating means for defining the carrier flow to each of the output electrodes.

A further aspect of this invention involves the use of a sampling electrode disposed between the last electrode and the outputs, whereby the carriers directed through the semiconductor substrate are sampled selectively. In one mode, a burst of carriers corresponding to one bit of information is sampled and read out upon the output electrodes, whereas in a second method of operation, the sampling is performed over longer intervals to permit a storage or integration of charges underneath the last electrode, whereby the sensitivity of the described CCD structure is increased.

BRIEF DESCRIPTION OF THE DRAWINGS

These and other objects and advantages of the present invention will become more apparent by referring to the following detailed description and accompanying drawings, in which:

FIGS. 6A and 6B–6G show, respectively, a diagrammatic view of the charge coupled device shown in FIGS. 1, 2, 4 and 5, and the progressive step-by-step transfer of minority carriers therethrough; and FIGS. 7A–7D show graphically the various voltage signals applied to the CCD of this invention to effect transfer of the minority carriers therethrough and to provide an output indicative of the strength and direction of the magnetic field applied thereto.

DESCRIPTION OF THE PREFERRED EMBODIMENTS

Figure 1:
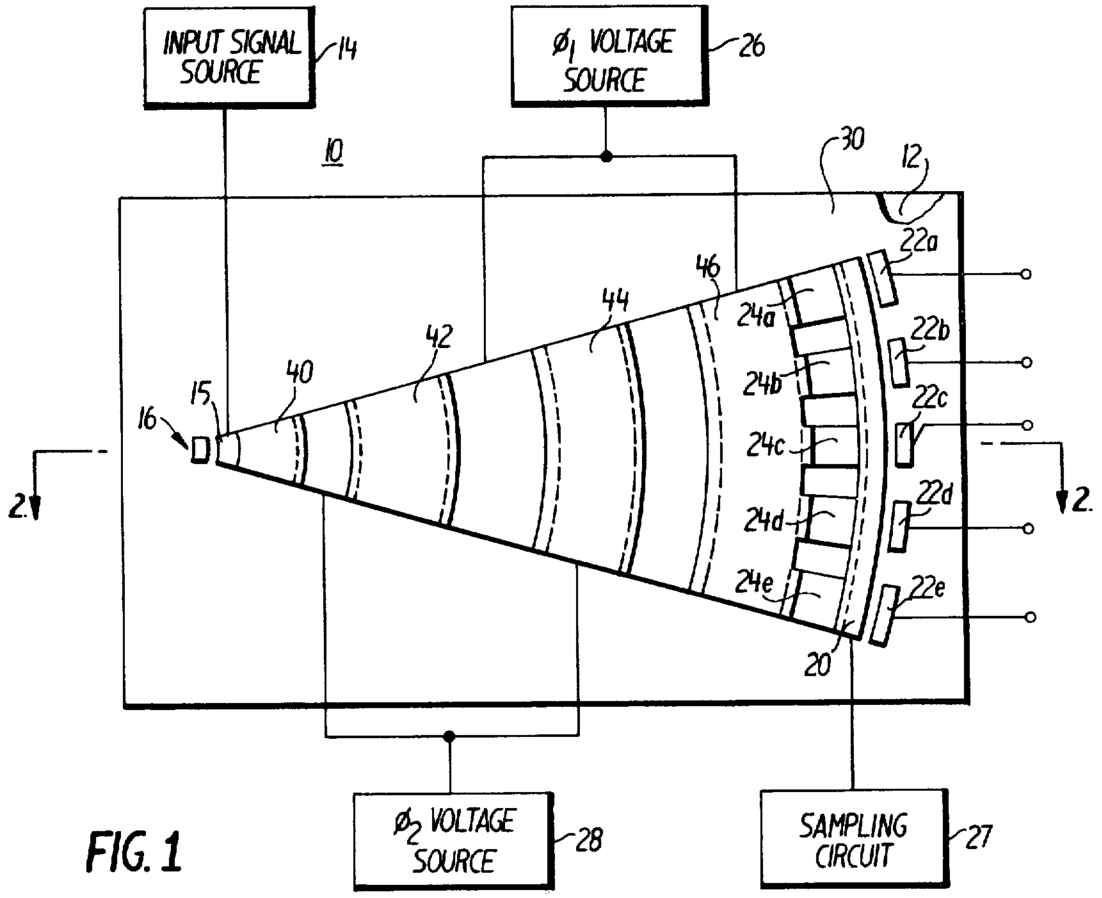
FIG. 1 is a plan view of a charge coupled device in accordance with teachings of this invention and further, diagrammatically shows the associated electrical circuitry.
Figure 2:
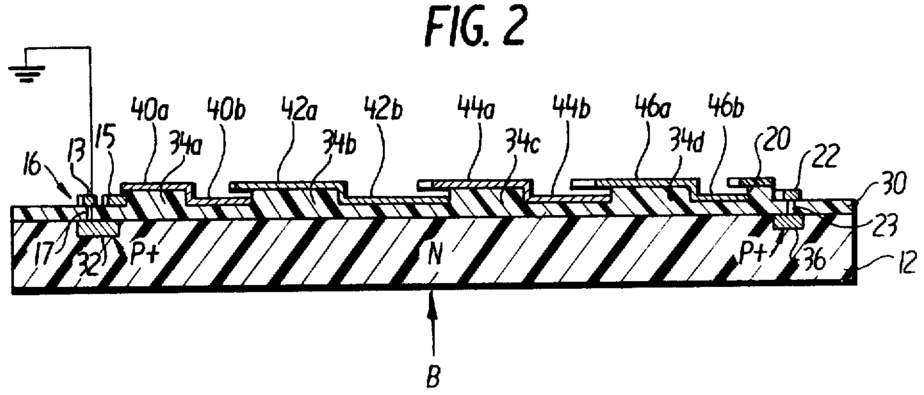
FIG. 2 is a cross-section of the charge coupled device shown in FIG. 1 as taken along lines II—II.

Referring now to the drawings and in particular to FIGS. 1 and 2, there is shown a charge coupled device (CCD) 10 in accordance with teachings of this invention, comprising a substrate 12 of a suitable semiconductive material upon which there has been disposed a layer 30 of a dielectric material. A source 16 is provided for injecting minority carriers into the substrate 12 to be moved sequentially to the right as shown in FIGS. 1 and 2 to be collected in a manner to be explained more fully by a plurality of output electrodes 22*a*–22*e*. The source 16 includes a contact 13 disposed upon the layer 30 as shown in FIG. 2, and is connected by a suitable conductive path 17 to a region 32 formed by a semiconductive material of a type opposite to that of the substrate 12, whereby a diode is formed therebetween. Upon suitable biasing of an input gating electrode 15 by an input signal source 14, minority carriers are injected into the substrate 12. A plurality of electrodes 40–46 corresponding to the various stages of the CCD 10 is disposed between the source 16 and the output electrodes 22. As more clearly shown in FIG. 1, the electrodes 40–46 are generally of a wedge-like configuration and have progressively increasing areas. The last electrode 46 has a plurality of fingers 24*a*–24*e* corresponding to each of the output electrodes 22*a*–22*e*, whereunder the carriers shifted from the region 32 are stored momentarily awaiting read-out. A sampling electrode 20 is disposed between the last electrode 46 and the plurality of output electrodes 22*a*–>*e*, upon the surface of the dielectric layer 30, as shown in FIG. 2. A sampling circuit 27 is connected to the electrode 20 for controlling the rate at which the stored charges are transmitted to the output electrodes 22 to be read-out thereby.

$\phi_1$ and $\phi_2$ voltage sources 26 and 28 apply complementary signals of substantially square-wave form to alternate of the electrodes 40–46 whereby the minority carriers introduced into the substrate 12 are shifted sequentially to the output electrodes 22, as will be more fully explained hereinafter. In particular, the $\phi_1$ voltage source 26 is connected to electrodes 42 and 46, whereas the $\phi_2$ voltage source 28 is connected to electrodes 40 and 44. Though only a two-phase system is shown in combination with four electrodes 40–46, it is understood that a three-phase system could be used with a different number of electrodes to advance the injected minority carriers to the output electrodes 22. In general, charge coupled devices (CCD) create and store minority carriers or their absence in potential wells which are spacially-defined regions where depletion momentarily is deepened at the interface of a homogeneous semiconductor and oxide insulator. Once stored, the charges coupled to the potential well are moved along the surface of the semiconductor substrate simply by shifting the potential from one electrode to the next. In particular, the electrodes 40–46 define those portions of the substrate 12 in which the potential wells of minority carriers may form (e.g. holes, where the substrate is of an n-type conductivity as shown in FIG. 2). The delay imparted to the minority carriers directed through the substrate 12 is given by the following expression:

$$\text{Delay} = \frac{2N}{f},$$

where $N$ equals the number of stages of the CCD, 10, and $f$ equals the frequency of the $\phi_1$ and $\phi_2$ voltages. The sensitivity of the CCD 10 to a magnetic field is dependent upon the number of its stages, the area beneath the electrodes 40–46 and the frequency of the $\phi_1$ and $\phi_1$ voltages. Generally, the larger the area beneath the electrodes 40–46 and the lower the frequency of the $\phi_1$ and $\phi_2$ voltages, the more sensitive the CCD 10 is to a magnetic field. The lower range of frequency operation is in the order of 10KHz in that the wells of minority carriers established underneath the electrodes 40–46 collapse due to thermal effects.

Figure 3:
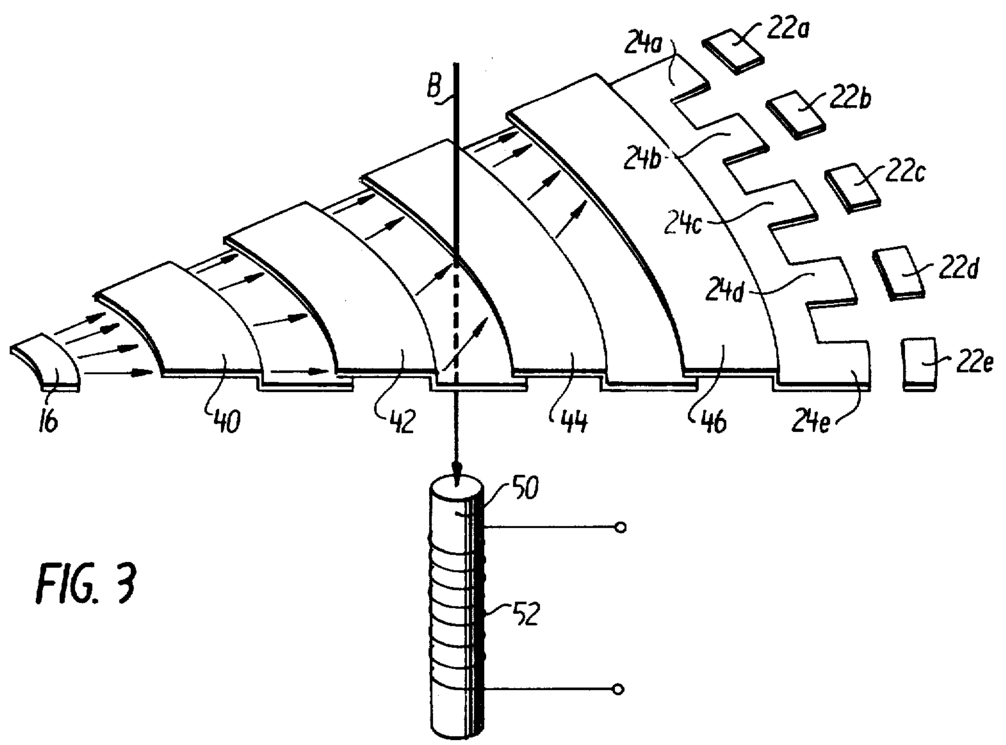
FIG. 3 is a perspective view showing the influence of a magnetic field upon the transition of electrons from the source to the output electrodes of the charge coupled device as shown in FIGS. 1 and 2.

FIG. 3 diagrammatically illustrates the operation of the CCD 10 of this invention. The carrier source 16 upon energization introduces a uniform distribution of minority carriers into the substrate 12. In the absence of a magnetic field, the carriers would travel with substantially even distribution towards the output electrodes 22. The CCD 10 of this invention is adapted particularly to sense the presence, absence and strength of a magnetic field indicated in FIG. 3 by the arrow B. For the purposes of illustration, a magnetic field source is shown in FIG. 3 as comprising a coil 52 and a core 50 for generating the magnetic field B. The minority carriers injected into the substrate 12 are influenced by the presence of a magnetic field B to be deflected as illustrated in FIG. 3, where a field B directed downward or into the page tends to deflect the holes toward the uppermost electrode 22*a*. As a result, when the stored charges as shifted to the last electrode 46 are read out, the current output from the electrode 22*a* is greater than that derived from the electrode 22*e*, i.e. the distribution of current outputs from the electrodes 22*a*–22*e* decreases in a substantially linear fashion. If the direction of the magnetic field B is reversed, the distribution of outputs as derived from the electrodes 22 also is reversed.

Though the source of a magnetic field is illustrated in FIG. 3 to be a coil 52 and a core 50, it is understood that the CCD 10 of this invention may be used in other applications where the magnetic source would take other forms. For example, the CCD 10 of this invention may be used to measure the magnetic field of the earth. Further, the CCD 10 of this invention may be constructed of an extremely small size so as to be used as a read-head for a high density magnetic tape or disk read-out system or as a sensor for a thin-film memory. In the latter application, it would be superior to the conventional methods of sensing magnetic fields because such prior art methods suffer from inefficient coupling between the magnetic field and the output sense lines, whereas the CCD 10 of this invention provides inherently efficient coupling; as aa result, the entire memory, addressing circuitry and computational circuitry may be constructed on a single semiconductor chip. In addition, the CCD 10 of this invention is adaptable to detect a magnetic field whose intensity is indicative of other quantities such as in devices such as wattmeters or ampmeters, for example.

An illustrative, two-phase method of operation will now be described with regard to FIGS. 6A to 6G and 7A to 7D. The $\phi_1$ and $\phi_2$ voltage sources 26 and 28 provide complementary square-wave outputs represented in FIGS. 7A and 7B, respectively. As shown in FIG. 6A, the $\phi_1$ and $\phi_2$ voltage signals are applied respectively to electrodes 40 and 44, and 42 and 46. The contact 13 as shown in FIG. 1 is connected illustratively to ground, whereby the minority carrier source 16 injects holes into the substrate 12. The input signal source 14 applies an input gating signal as shown in FIG. 7C for gating selectively the passage of the minority carriers thereby. As seen in FIGS. 7B and 7C, the input gating signal and the $\phi_2$ voltage are in-phase in the sense that the most negative potentials of each signal are applied simultaneously to the gating electrode 15 and to the first electrode 40, whereby first and second wells of increasing depth are formed at time period A, respectively below the electrodes 15 and 40 to permit the minority carriers to flow into a second well formed beneath the first electrode 40, as shown in FIG. 6B.

When the $\phi_1$ voltage signal is at its least negative level in time periods A, C, E, etc. the $\phi_2$ is at its most negative level, as seen in FIGS. 7A and 7B, whereby four wells of increasing depth are formed within the substrate 12 beneath the first and second electrodes 40 and 42, as shown in FIGS. 6C and 6E. As shown pictorially in FIG. 2 and graphically in FIG. 6A, a series of pedestals 34a–34d is formed beneath the leading portions designated by the notation "a" of the electrodes 40–46, respectively. Thus, when a potential is applied to one of the electrodes 40 to 46, first and second wells are formed beneath each electrode, the first well being formed beneath the corresponding pedestal 34 and the electrode portion designated "a", of a smaller depth due to the presence of its pedestal, whereas the second well is formed to a greater depth beneath the electrode portion designated "b".

In a first stage of operation at time A as seen in FIG. 6B, a $\phi_1$ voltage of approximately −10 volts is applied to the electrodes 42 and 46, the $\phi_2$ voltage of approximately −20 volts is applied to the electrodes 40 and 44, and a gating voltage of −10 volts is applied to the gating electrode 15. At time period A, four wells of increasing depth are formed beneath the source 16, and electrodes 15, 40 and 42, whereby minority carriers are directed "downhill" into the well of the greatest depth beneath the electrode 40b. In the next stage at time period B as shown in FIG. 6C, the $\phi_1$ and $\phi_2$ potential levels are reversed with −20 volts being applied to electrodes 42 and 46 and a potential level of −10 volts being applied to electrodes 40 and 44. Thus, a relatively large well is formed beneath the electrode portion 42b, whereby the minority carriers are directed thereto. In a similar manner, the charges are conveyed to that well formed underneath the electrode portion 44b at time period C as shown in FIG. 6D, and then to that well underneath electrode portion 46b at time period D a shown in FIG. 6E. The minority carriers now are stored beneath the fingers 24 (See FIG. 1) of the last electrode 46 in a distribution dependent upon the strength and direction of the magnetic field to which the CCD 10 is exposed. In order to read these carriers out, the output gating signal as shown in FIG. 7D is switched to its most negative level, e.g. −20 volts, in synchronization with the rise of the $\phi_1$ voltage to its least negative voltage level, e.g. −10 volts. Wells are formed at time E beneath the electrode 46 and the output electrode 20 of increasing depths, as shown in FIG. 6F, whereby the charges are permitted to flow toward the output electrodes 22 to be collected by the output diode comprising the p+ region 36. As shown in FIG. 6G, a voltage output is obtained from the output electrodes across resistor 54 at time period E.

Figure 5:
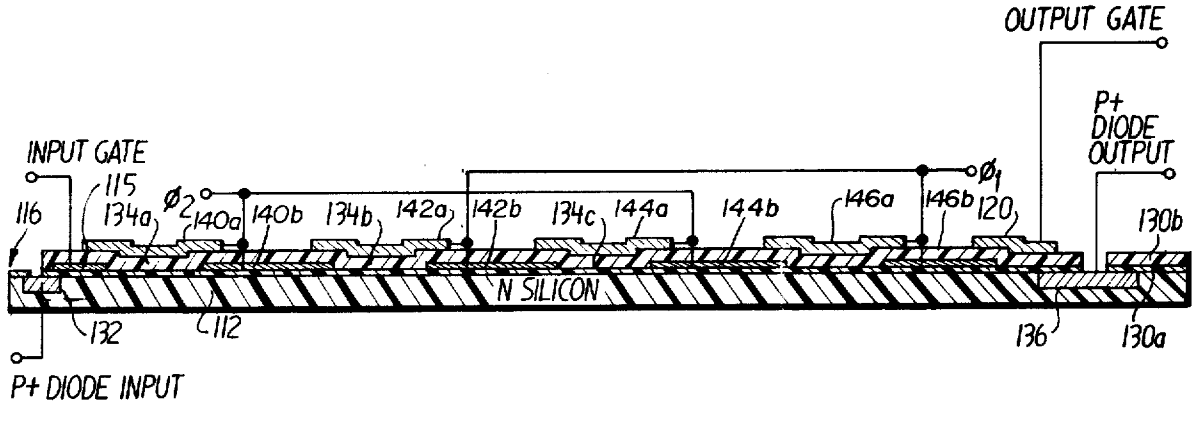
FIGS. 4 and 5 are respectively a bottom and side view of another embodiment of this invention.
Figure 4:
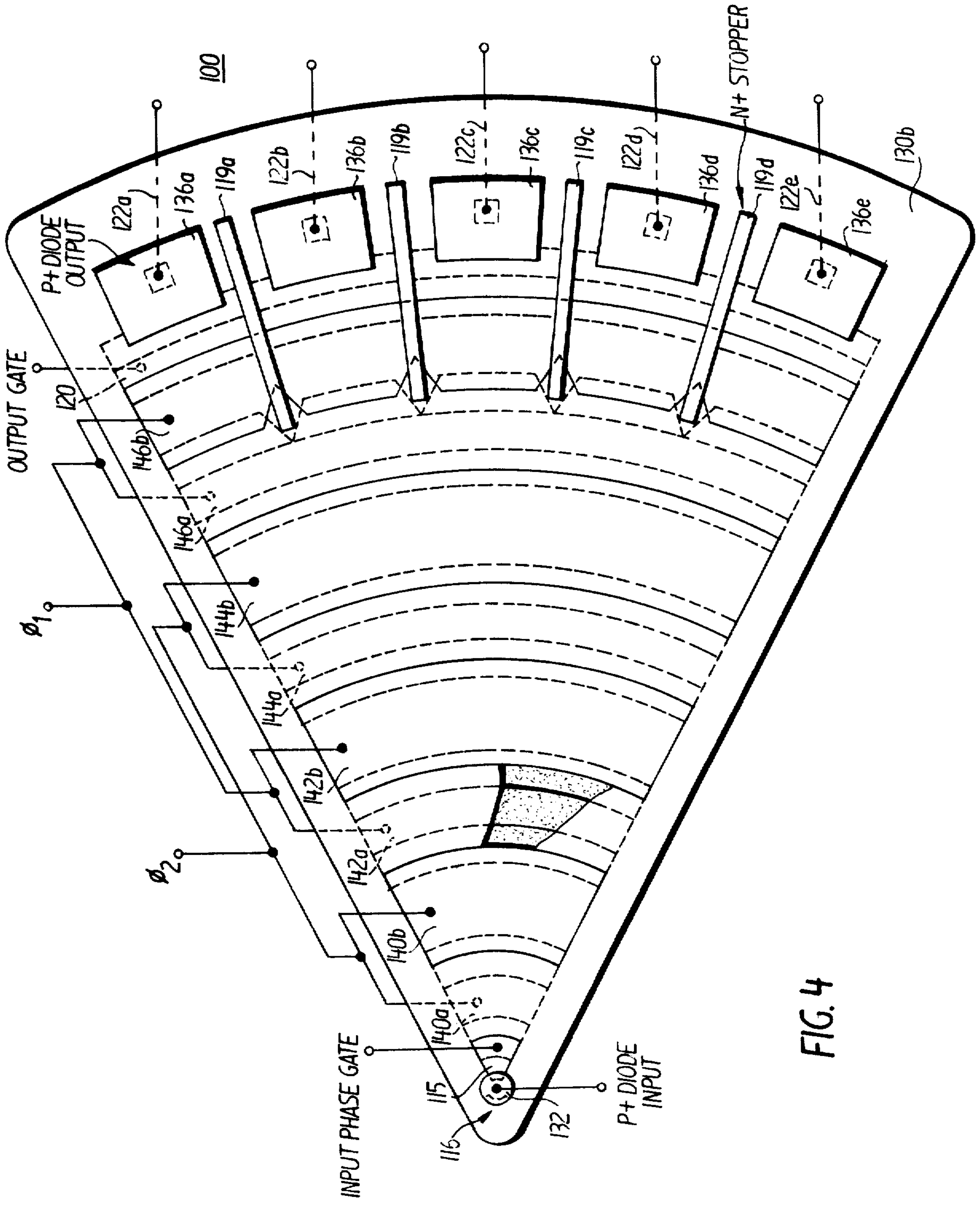

In FIGS. 4 and 5, there is shown a more detailed embodiment of the charge coupled device of this invention with similar elements being identified by the same number as those in FIGS. 1 and 2 with the exception that the numbers are placed in the 100's. In particular, the CCD 100 includes a substrate 112 in which there is formed a first region 132 of a p-type conductivity to form a diode whereby minority carriers may be injected into the substrate 112, and a second region 136 of a p-type conductivity material for forming a diode for collecting the holes directed through the substrate 112. A first layer 130a of a suitable insulating material such as silicon dioxide is formed upon the substrate 112 with suitable openings whereby electrical contact may be made to the regions 132 and 136. Next, the input gate electrode 115, and the electrode portions 140b, 142b, 144b and 146b are disposed upon the first layer 130a. A second layer 130b of a like insulating material is disposed thereon and the electrode portions 140a, 142a, 144a, 146a and the output gate electrode 120 are disposed upon the second insulating layer 130b. In contrast to the embodiment of FIGS. 1 and 2, stopper regions 119a–119d are formed between the regions 136a–136e associated with the corresponding output electrodes 122a–122e, for providing isolating means whereby the transferred minority carriers are stored and isolated until sampled as explained above. As shown in FIG. 5, suitable electrical interconnection is made between the upper and lower portions *a* and *b* of the electrodes 140–146.

As explained above, input signals as derived from source 16 are applied to the CCD 10 by applying a series of pulses illustratively of a −10 volts amplitude to the input electrode 15, whereby a corresponding series of charges is conveyed along the length of the substrate 12. The charges are transferred to the output electrodes 22 under the control of sampling signals derived from the circuit 27 and applied to the output electrode 20. In one mode of operation, the sampling circuit 27 applies a series of pulses of a first frequency or rate corresponding to that with which the input signals are applied to the electrode 15, whereby each bit of information corresponding to an input pulse is read-out as it is transmitted through the substrate 12. The CCD 10 of this invention also is capable of operating in an integration mode, wherein the charges, as transferred along the length of the substrate 12, are stored beneath the fingers 24 to be read-out after an integration period as determined by the frequency of the sampling signal derived from the circuit 27. In the integration mode, the sampling is applied at a second rate less than the first rate to provide a longer integration period whereby more than one charge (corresponding to one input pulse) is collected and integrated underneath the fingers 24. The length of the integration period is limited by the quantity of charge that may be stored beneath the fingers 24 within the substrate 12. Thus, the CCD 10 of the present invention represents a significant improvement over the prior art Hall devices in that it may be operated as an integrator without any additional components.

As particularly shown in FIG. 1, the CCD 10 is configured in a wedge-like shape in order to more effectively take advantage of the current displacement under the influence of the magnetic field. Further, such a configuration permits the use of a relatively large number of output terminals 22, as seen in FIG. 1. In its simplest form, only two output terminals are necessary for the CCD 10 of this invention to operate as a binary system. The provision of multiple output terminals permits the use of this device as an analog-to-digital converter or random addresser, for example.

The two-phase CCD 100 illustratively shown in FIGS. 4 and 5 may be manufactured in accordance with the following procedures. The substrate 112 may be selected of a starting material of <100> oriented, 4–8 ohm-cm, n-type wafer. Such a wafer is given a chemical polish which removes 1–2 mils from each surface of the wafer to produce a lower defect area prior to the oxide growth in the charge transfer regions. Next, an n+ stopper diffusion is formed in those areas of the substrate 112 to define the path of travel of the minority carriers within the substrate as defined by the electrodes 115, 140, 142, 144, 146 and 120, and to form barriers 119*a*–119*d*. Next, a p+ diffusion is carried out to form the regions 132 and 136, as shown in FIG. 5. Next, a masking oxide is stripped over the entire substrate 112 and a thin SILOX layer is deposited. The SILOX layer is etched such that oxide remains in the areas above the previous n+ diffusion to protect against autodoping of the remainder of the substrate 112 during the subsequent gate oxidation cycle. A special cleaning procedure is used prior to oxidation of the gate and charge transfer regions to provide a low interface state density, illustratively in the order of $2\times10^{10}cm^2$. Next, an 1100 Angstrom dry oxide is grown upon the substrate 112 and annealed during the 4-hour gate oxidation cycle (3 hour dry $O_2$ + 1 hour dry $N_2$), whereby the first layer 130*a* of dielectric material is formed. Next, a 7000 Angstrom layer of aluminum is deposited and then photoengraved to form the input electrode 115 and the lower electrode portions 140*b*, 142*b*, 144*b* and 146*b*. Next, an undensified layer of SILOX is deposited at temperatures less than that of the melting point of aluminum to form a second insulating layer 130*b*, including the pedestals 134 as shown in FIG. 5. Next, the layers of SILOX and silicon dioxide are photoengraved to form contact windows for the regions 132 and 136, and openings termed "via windows" to permit contact with the lower portions "*b*" of the electrodes 140, 142, 144 and 146. Next a layer of aluminum is electron beam evaporated and photoengraved to form the upper portions "*a*" of the electrodes 140, 142, 144 and 146. Though not shown in the drawings, a protective layer of SILOX deposited to an illustrative depth of 13,000 Angstroms is deposed over the entire assembly and suitable contact or via windows are formed therein to permit electrical contact to the various electrodes formed upon the device 10. Finally, the entire assembly is sintered at approximately 500°C for 25 minutes and suitable electrical tests are performed.

Thus, there has been described a CCD of great sensitivity to magnetic fields and having inherent advantages over the Hall effect devices of the prior art. In the Hall effect devices of the prior art, a voltage is generated, whereas in the CCD of this invention, a current displacement is effected in response to the presence of a magnetic field. The dependence upon a current output results in a more magnetically sensitive device because the Hall coefficients $R_H$, upon which the Hall voltage depends, are small, which factor cannot be compensated by separation of the Hall probes. In addition, the CCD of the present invention unlike Hall effect devices, is capable of signal integration, and further requires low power to be operated.

Numerous changes may be made in the above-described apparatus and the different embodiments of the invention may be made without departing from the spirit thereof; therefore, it is intended that all matter contained in the foregoing description and in the accompanying drawings shall be interpreted as illustrative and not in a limiting sense.

What is claimed is:

1. A charge coupled device (CCD) for sensing a magnetic field, said CCD comprising:

a. a substrate of semiconductor material for providing a path for the passage of minority carriers therethrough;

b. a first layer of dielectric material overlying said substrate;

c. source means for injecting a substantially uniform distribution of minority carriers within said substrate;

d. first and second output means for collecting the minority carriers directed along said path of said substrate and each providing an output signal indicative of the collected minority carriers;

e. a plurality of electrodes disposed along said path of said CCD between said source means and said first and second output means and overlying said first layer of dielectric material for defining underlying portions of said substrate wherein minority carriers are collected;

f. means for applying varying potential signals to said electrodes for directing the minority carriers at a first rate from one underlying portion to the next along the path of said substrate, whereby the minority carriers are deflected as they are directed through the substrate in the presence of the magnetic field;

g. an input gate electrode disposed upon said first layer of dielectric material intermediate said source means and the first of said plurality of electrodes;

h. input signal source means electrically coupled to said input gate electrode for controlling the travel of minority carriers to said plurality of electrodes;

i. a sampling electrode disposed upon said first layer of dielectric material intermediate the last of said plurality of electrodes and said first and second output means;

j. output signal source means electrically coupled to said sampling electrode for applying sampling signals to said sampling electrode at a second rate, slow with respect to the first rate whereby the minority carriers are permitted to be stored in that region beneath the last of said plurality of electrodes for a relatively long integration period before being sampled by the application of a sampling signal derived from said sampling means; and k. said first and second output means spaced from each other and disposed traverse to the path for collecting the minority carriers as deflected by the magnetic field, the output signals derived at said first and second output means indicating the strength and direction of the magnetic field.

2. The charge coupled device as claimed in claim 1, wherein said source means comprises a diode comprising a region formed within said substrate of a conductivity opposite to that of said substrate.

3. The charge coupled device as claimed in claim 1, wherein each of said output means comprises a diode comprising a region formed within said substrate of a conductivity opposite to that of said substrate.

4. The charge coupled device as claimed in claim 1, wherein said plurality of electrodes as disposed between said source means and said first and second output means, are of an increasing area.

5. The charge coupled device as claimed in claim 4, wherein said plurality of electrodes forms together a wedge-like configuration.

6. The charge coupled device as claimed in claim 1, wherein said last of said plurality of electrodes includes first and second finger portions extending toward said first and second output means, respectively, for defining the paths of the minority carriers as they are directed to said first and second output means.

7. The charge coupled device as claimed in claim 1, wherein said plurality of electrodes is disposed serially between said source means and said output means and each thereof includes a first portion disposed closer to said source means and a second portion disposed closer to said output means, and a plurality of corresponding pedestals of an insulating material upon which each of said first portions is disposed, and said potential applying means comprising first and second sources of complementary varying signals, each applied to alternating ones of said plurality of electrodes whereby the minority carriers are directed successively through said substrate.

8. The charge coupled device as claimed in claim 1, wherein there is included isolation means disposed within said substrate between said first and second output means for directing the minority carriers thereto.

9. A charge coupled device (CCD) for sensing a magnetic field, said CCD comprising:

a. a substrate of semiconductor material for providing a path for the passage of minority carriers therethrough;
b. a first layer of dielectric material overlying said substrate;
c. source means for injecting a substantially uniform distribution of minority carriers within said substrate;
d. first and second output means for collecting the minority carriers injected into said substrate and each providing an output signal indicative of the collected minority carriers;
e. a plurality of electrodes disposed along said path of said CCD between said source means and said first and second output means and overlying said first layer of dielectric material for defining underlying portions of said substrate wherein minority carriers are collected;
f. means for applying varying potential signals to said electrodes for directing the minority carriers from one underlying portion to the next along said path of said substrate at a first rate, whereby the minority carriers are deflected as they are directed through said substrate in the presence of the magnetic field;
g. said first and second output means spaced from each other and disposed transversely of said path of said CCD for collecting the minority carrierss as deflected by the magnetic field, the output signals derived at said first and second output means indicative of the strength and direction of the magnetic field;
h. a sampling electrode disposed upon said first layer of dielectric material intermediate the last of said plurality of electrodes and said first and second output means; and
i. output signal source means electrically coupled to said sampling electrode for applying sampling signals to said sampling electrode at a second rate sufficiently slow with respect to the first rate whereby the minority carriers are stored in that region beneath the last of said pluraltiy of electrodes for a relatively long integration period before being sampled by the application of a sample signal of said output signal source means.

10. A method of operating a charge coupled device (CCD) to sense a magnetic field, the CCD comprising a semiconductor substrate upon which there is disposed a layer of dielectric material, source means for injecting a substantially uniform distribution of minority carriers into the substrate, first and second output means for collecting the minority carriers directed through the substrate for providing corresponding output signals, a plurality of electrodes disposed overlying said dielectric layer, serially between the source and output means, and a sampling electrode disposed upon the dielectric layer between the plurality of electrodes and the output means, said method comprising the steps of:

a. energizing the source means to inject a substantially uniform distribution of minority carriers into said substrate;
b. applying potential signals to the electrodes whereby "wells" of varying depth are formed in the substrate into which the minority carriers are directed and varying the potential signals at a first rate whereby the minority carriers are directed through said substrate toward the first and second output means;
c. exposing the charge coupled device to a magnetic field whereby the minority carriers are deflected in accordance with the strength and direction of the magnetic field; and
d. applying a sample signal to the sampling electrode at a second rate sufficiently slow with respect to the first rate to permit deflected minority carriers to be stored beneath the last of the plurality of electrodes before being directed to the output means which provide an integrated output signal therefrom thus increasing the sensitivity of the magnetic sensing CCD.

* * * * *